United States Patent
Lecouras et al.

[11] Patent Number: 5,900,177
[45] Date of Patent: May 4, 1999

[54] FURNACE SIDEWALL TEMPERATURE CONTROL SYSTEM

[75] Inventors: George T. Lecouras, Peabody, Mass.; Dennis P. Rodier, Francestown, N.H.

[73] Assignee: Eaton Corporation, Cleveland, Ohio

[21] Appl. No.: 08/873,351

[22] Filed: Jun. 11, 1997

[51] Int. Cl.⁶ .................................................. H05B 1/02
[52] U.S. Cl. ......................... 219/497; 219/483; 219/486; 392/416; 437/247; 373/136
[58] Field of Search .................. 219/483–486, 219/497, 501, 508; 392/416, 411, 557; 373/18–25, 144, 136; 437/241, 248, 982

[56] References Cited

U.S. PATENT DOCUMENTS

| | | | |
|---|---|---|---|
| 2,266,002 | 12/1941 | Clark | 13/26 |
| 2,462,202 | 2/1949 | Kniveton | 148/13 |
| 2,668,701 | 2/1954 | Dietrich | 263/3 |
| 3,536,309 | 10/1970 | Gohin et al. | 266/24 |
| 4,195,820 | 4/1980 | Berg | 266/87 |
| 4,857,689 | 8/1989 | Lee | 219/10.71 |
| 4,950,870 | 8/1990 | Mitsuhashi et al. | 219/390 |
| 4,966,547 | 10/1990 | Okuyama et al. | 432/9 |
| 5,001,327 | 3/1991 | Hirasawa et al. | 219/390 |
| 5,171,972 | 12/1992 | Hidano | 219/390 |
| 5,258,601 | 11/1993 | Takano | 219/486 |
| 5,323,484 | 6/1994 | Nakao et al. | 392/416 |
| 5,329,095 | 7/1994 | Okase | 219/390 |
| 5,387,557 | 2/1995 | Takagi | 437/247 |
| 5,418,885 | 5/1995 | Hauser | 392/416 |
| 5,500,388 | 3/1996 | Niino et al. | 437/89 |
| 5,533,736 | 7/1996 | Yamaga | 277/3 |
| 5,578,132 | 11/1996 | Yamaga | 118/724 |
| 5,616,264 | 4/1997 | Nishi et al. | 219/494 |
| 5,635,409 | 6/1997 | Moslehi | 438/7 |

*Primary Examiner*—Mark Paschall
*Attorney, Agent, or Firm*—John A. Kastelic

[57] ABSTRACT

A vertical rapid thermal processing (RTP) system (10) is provided, comprising a vertical process chamber (20) extending along a longitudinal axis (X), and a movable platform (32) disposed within the process chamber and having a support surface upon which one or more substrates such as semiconductor wafers (W) may be mounted for processing. A temperature control subsystem (56, 58, 60) establishes a continuous temperature gradient within the vertical process chamber along the longitudinal axis. The temperature control subsystem comprises a plurality of chamber sidewall heating elements (24) located at different vertical positions along the longitudinal axis. Each of the plurality of heating elements is controlled independently of the other of the plurality of heating elements. The plurality of longitudinally oriented heating elements provides an active sidewall heating mechanism which results in a consistent and continuous temperature gradient within the chamber, independent of the position of the wafer within the chamber or the number of wafers which have been processed.

7 Claims, 3 Drawing Sheets

FURNACE SIDEWALL TEMPERATURE CONTROL SYSTEM

FIELD OF THE INVENTION

The present invention relates generally to the field of semiconductor thermal processing systems, and more specifically to a vertical rapid thermal processing furnace utilizing multiple continuous heat sources for maintaining a desired constant temperature gradient within the furnace.

BACKGROUND OF THE INVENTION

Thermal processing systems are widely used in various stages of semiconductor fabrication. Basic thermal processing applications include chemical deposition, diffusion, oxidation, annealing, silicidation, nitridation, and solder re-flow processes. Vertical rapid thermal processing (RTP) systems comprise a vertically oriented processing chamber which is heated by a heat source such as a resistive heating element or a bank of high intensity light sources. The heat source is capable of heating the interior of the processing chamber to temperatures in the range of 450–1400 degrees Centigrade (°C.) at ramp rates of up to about 100° C./sec.

One example of a vertical RTP system for treating a single wafer is shown in U.S. Pat. No. 4,857,689 to Lee, assigned to the assignee of the present invention and incorporated by reference as if fully set forth herein. The Lee patent discloses a process chamber which is heated by a resistive heating element located atop the chamber. The resistive heating element heats the process chamber so that a temperature gradient is obtained from the top of the chamber (hottest) to the bottom of the chamber (least hot). The chamber sidewalls exhibit this temperature gradient which, for the sidewalls, is obtained by (i) heat which is conducted down the sidewalls from the top of the chamber and (ii) heat which is radiated convectively through the chamber from the resistive heater. An elevator which supports a wafer is moved up and down within this temperature gradient by a process control system so that desired heating of the wafer occurs.

The single-heater construction such as that shown in Lee imposes process characteristics which may adversely affect the processing of a single wafer, as well as multi-wafer system throughput. Because the wafer and the pedestal upon which it is supported occupies a significant portion of the total vertical cross sectional area of the process chamber, the wafer and pedestal block heat radiating from the top resistive heating element, which prevents the blocked heat from reaching and heating the portion of the chamber below the wafer. Accordingly, during the processing of a single wafer, the sidewall temperature gradient may be characterized by significant temperature discontinuities, depending upon the particular sidewall location and the position of the wafer with respect to that location. Such temperature discontinuities render precise heating of the wafer difficult.

In addition, a single heater construction is also characterized by a sidewall temperature gradient which initially drifts and then stabilizes only after several wafers have been processed. This drift phenomenon slows start-ups and therefore reduces system throughput. It is suspected that, because the chamber sidewalls are heated by both convective and conductive heating, the extent of conductive heating progresses to such an extent after the processing of several wafers so as to reduce the adverse affect of radiant (convective) heat blockage by the wafer. After the successive processing of multiple wafers, this problem disappears. In some cases this problem has been accommodated by the initial processing of dummy wafers, which adversely affects system throughput. However, even the use of dummy wafers will not cure the sidewall temperature gradient discontinuity experienced during the processing of single wafers. That is, during processing of each individual wafer, the wafer still functions to block radiant heat and thus the sidewall temperature at a particular location fluctuates depending upon whether the wafer is located above or below that location.

Accordingly, it is an object of the present invention to provide a single wafer RTP vertical furnace using a plurality of continuous heat sources located at various vertical locations of the furnace to provide for a consistent and continuous temperature gradient within the chamber.

It is a further object of the present invention to provide such a furnace having an active sidewall heating mechanism for providing a consistent temperature reading at a particular vertical location of the sidewall, independent of the position of the wafer within the furnace, and independent of the number of wafers which have been processed.

SUMMARY OF THE INVENTION

A vertical rapid thermal processing (RTP) system is provided, comprising a vertical process chamber extending along a longitudinal axis, and a movable platform disposed within the process chamber and having a support surface upon which one or more semiconductor wafers may be mounted for processing. A temperature sensor such as an optical pyrometer may be used for sensing the temperature of the backside of the wafer located on the platform. When the system is run in a closed loop control configuration, a position controller receives a feedback signal from the optical pyrometer and provides in response thereto a position signal to a movement mechanism. The movement mechanism adjusts the vertical position of the movable platform within the vertical process chamber.

A temperature control subsystem establishes a continuous temperature gradient within the vertical process chamber along the longitudinal axis. The temperature control subsystem comprises a plurality of chamber sidewall heating elements located at different vertical positions along the longitudinal axis. Each of the plurality of heating elements is controlled independently of the other of the plurality of heating elements. The plurality of longitudinally oriented heating elements provides an active sidewall heating mechanism which results in a consistent and continuous temperature gradient within the chamber, independent of the position of the wafer within the chamber or the number of wafers which have been processed. The top heating element applies more heat to the wafer center, and the side heating element or elements applies more heat to the wafer edge. Independent control of the plurality of heating elements permits direct control of the radial temperature profile across the wafer.

DETAILED DESCRIPTION OF A PREFERRED EMBODIMENT

Figure 1:
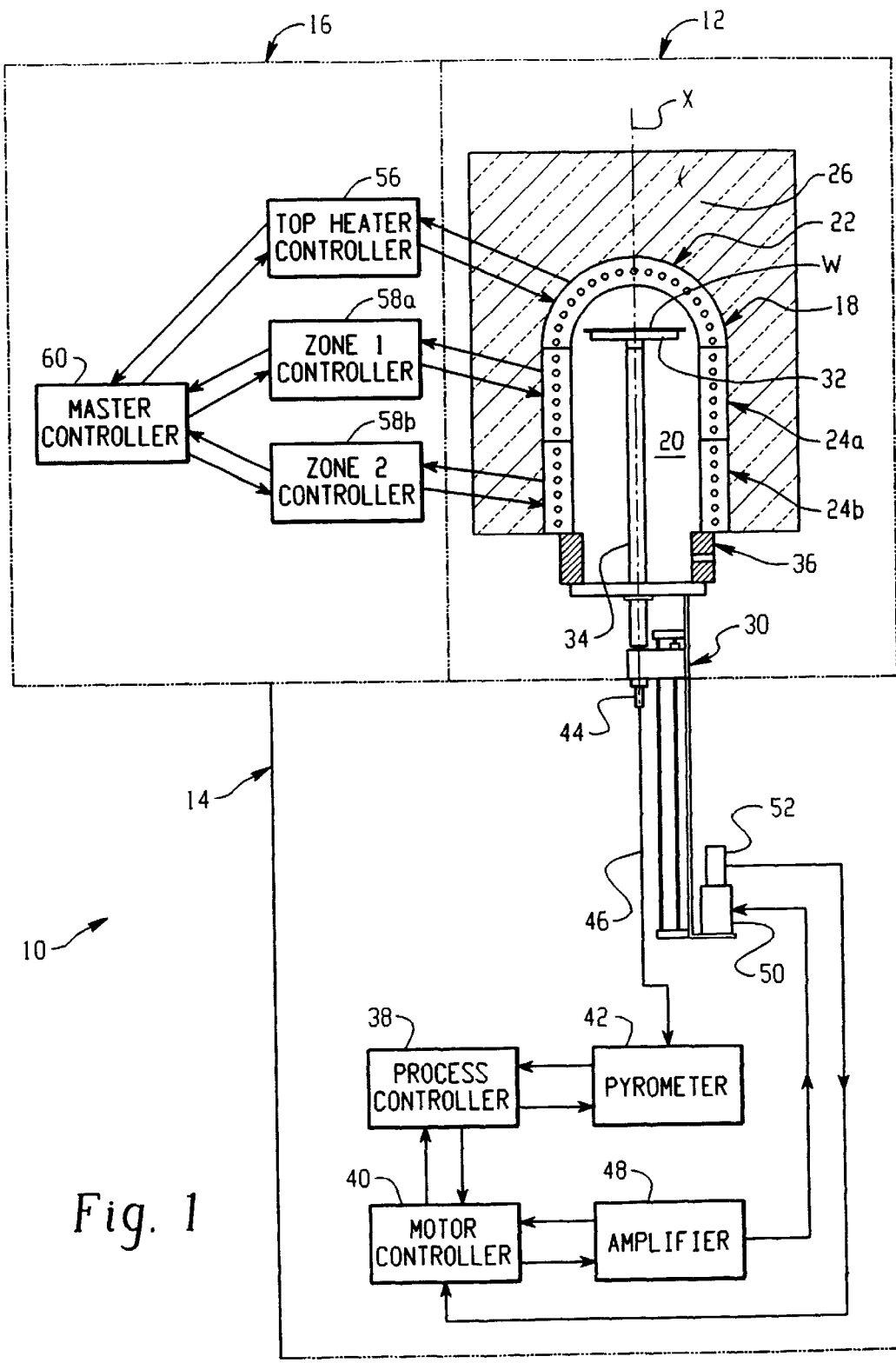
FIG. 1 is a sectional view of a sidewall-heated vertical rapid thermal processing system constructed according to the principles of the present invention.

Referring now to the drawings, FIG. 1 discloses a vertical rapid thermal processing (RTP) system 10 for heat treating one or more substrates such as semiconductor wafers W. The RTP system 10 comprises a process device 12 which includes a heating mechanism for creating a vertical temperature gradient region and a movement mechanism for vertically moving the wafer within this region; a system controller 14 for controlling the vertical position of the wafer within the temperature gradient; and a heater controller 16 for controlling the heating mechanism of the process device. Alternatively, the heater controller 16 may be incorporated into the system controller 14, e.g., within the process controller 38.

The process device 12 includes a closed end tube 18, such as a quartz bell jar, which defines a process chamber 20. The interior of the bell jar 18 is heated by top heater module 22 surrounding the top of the bell jar, and at least one additional sidewall heater module 24 surrounding the sidewall of the bell jar. In the disclosed embodiment, two sidewall heater modules 24a–b are shown. Preferably, the top and sidewall heater modules comprise a plurality of resistive heating elements disposed circumferentially about the perimeter of the bell jar 18, although the invention contemplates that other types of heaters may be used. Insulation 26 surrounds the heating elements.

Energization of the heating elements 22 and 24a–b creates a vertical temperature gradient along a central longitudinal axis X of the bell jar, extending from the top of the jar (hottest) to the bottom of the jar (least hot). Vertical movement of the wafer W within the temperature gradient subjects the wafer to a desired heating process. Temperature ramp-up and ramp-down rates of the wafer being processed are controlled by the vertical location of the wafer within the process chamber 20, rather than varying the temperature of the process chamber. Vertical movement of the wafer is effected by an elevator assembly 30, which includes a pedestal 32 connected to a support tube 34. Wafers to be treated are loaded upon and unloaded from the pedestal 32 through transfer chamber 36.

The system controller 14 controls the vertical position of the pedestal 32, and thus the wafer W, within the temperature gradient established in the process chamber 20. A process controller 38, such as a microprocessor, provides a signal to motor controller 40 based on a stored, desired thermal process recipe and, when operated under closed loop control, wafer temperature feedback provided by pyrometer 42. A pyrometer head 44 is aimed toward the underside of the wafer W to obtain the temperature feedback and is connected to the pyrometer 42 by means of an optical fiber 46. The motor controller output drives an amplifier 48 which in turn drives a servomotor 50 to raise or lower the support tube 34. A position encoder 52 provides position feedback to the motor controller. Such a closed-loop position control system as provided by the system controller 14 is known in the art. Alternatively, the system may be run in open loop configuration, without using feedback from the pyrometer 42.

As shown in FIG. 1, in one embodiment, the heater controller 16 comprises a top heater controller 56 for controlling operation of the top heater module 22, and zone controllers 58a–b for controlling the sidewall heater modules 24a–b, respectively. A master controller 60 is used to control the operation of the individual controllers 56 and 58a–b to effectively coordinate operation of the RTP system 10. In another embodiment, a separate software-based P-I-D control loop may be provided for each heating element in the system, coordination of which is accomplished by the process controller 38, rather than master controller 60.

Although two sidewall zone controllers are shown in FIG. 1 to control two sidewall heater modules (in addition to the top heater module 22 which is controlled by top heater controller 56), such a configuration is made merely for example. The present invention is directed to any heater configuration in which a plurality of independently controlled heaters are disposed at different locations along the vertical axis X of the process chamber to create a stepless temperature gradient within the process chamber. As used herein, "stepless" shall mean the establishment of a continuous temperature gradient within the process chamber, rather than a series of discrete zones of different temperatures connected by intermediate transition regions. Although the heaters may assume any number of known resistive or lamp-based configurations, in the embodiment shown, each of the heaters comprises a resistive heating element positioned circumferentially about the outside of the bell jar 18, so that they circumscribe the sidewalls of the jar.

Figure 2:
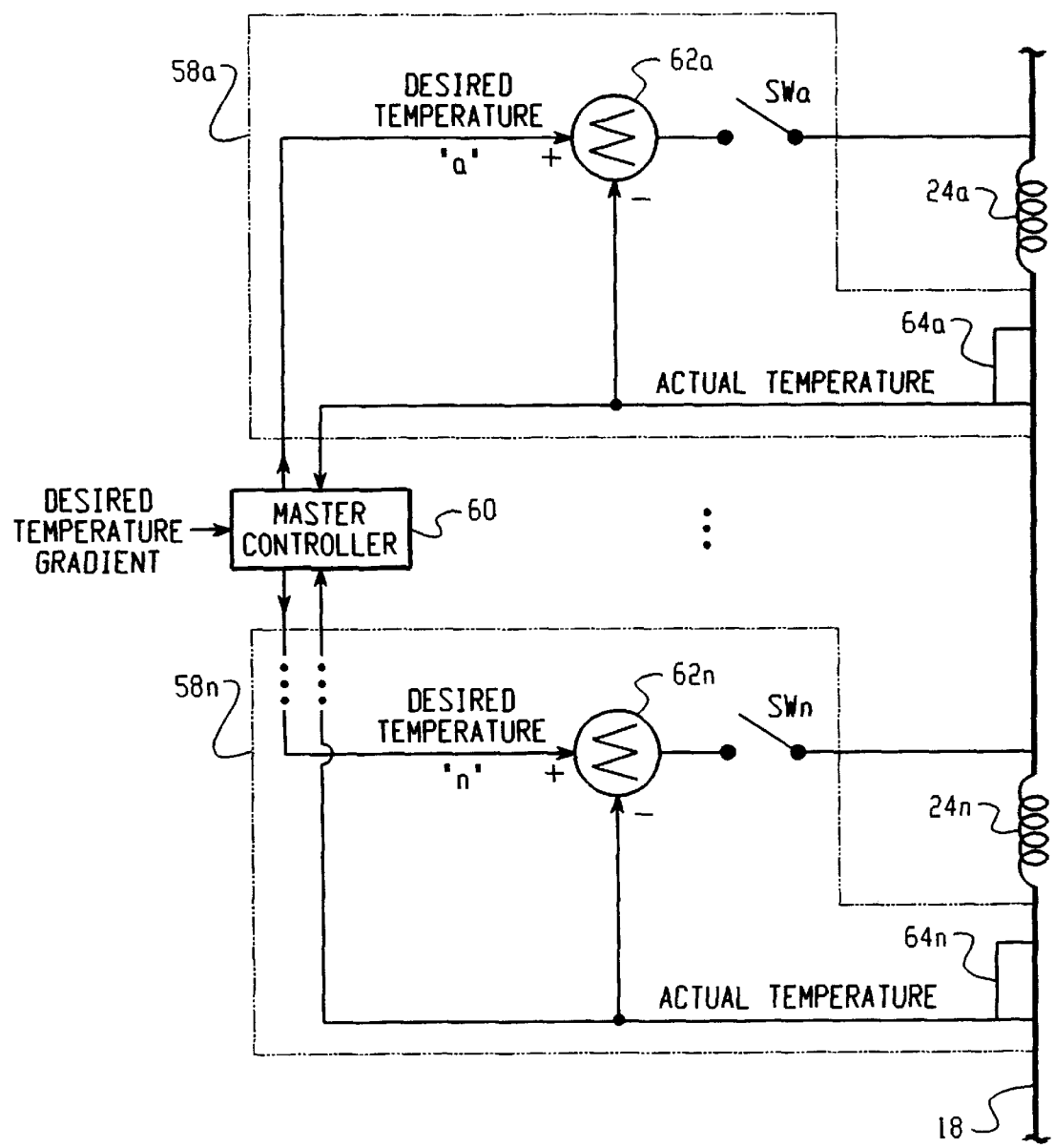
FIG. 2 is a schematic of the sidewall heating control system of the rapid thermal processing system of FIG. 1.

FIG. 2 shows the sidewall heating control system provided by the present invention. As shown in FIG. 2, the master controller 60 stores or receives from a storage device (not shown) the desired temperatures at a plurality n of vertical positions within the process chamber 20, thereby establishing the desired continuous temperature gradient within the chamber. The plurality n of vertical positions represent the plurality of heater modules used to heat the process chamber 20 within the bell jar 18 (e.g., a top heater module and one or more sidewall heater modules, or two or more sidewall heater modules).

A closed loop control system is provided for each heater module 24 in the system. Although FIG. 2 shows only sidewall heater modules 24a–24n and corresponding sidewall zone controllers 58a–58n, a similar control system may be utilized for the top heater module when one is included in the system 10. Each zone controller 58 includes a summing junction (e.g. a thermostat) 62 for receiving a desired temperature reference input signal from the master controller 60 and an actual temperature feedback signal from a thermocouple 64 located on the bell jar sidewall 18. A switch SW is used in each controller 58a–n for energizing and deenergizing the heater module 24a–n independently of other heater modules in the system, depending on the difference between the desired and actual sidewall temperatures, to achieve a constant desired sidewall temperature gradient. With each zone controller 58 controlled by the master controller, a desired, constant, stepless temperature gradient is achieved within the bell jar process chamber 20.

Figure 3:
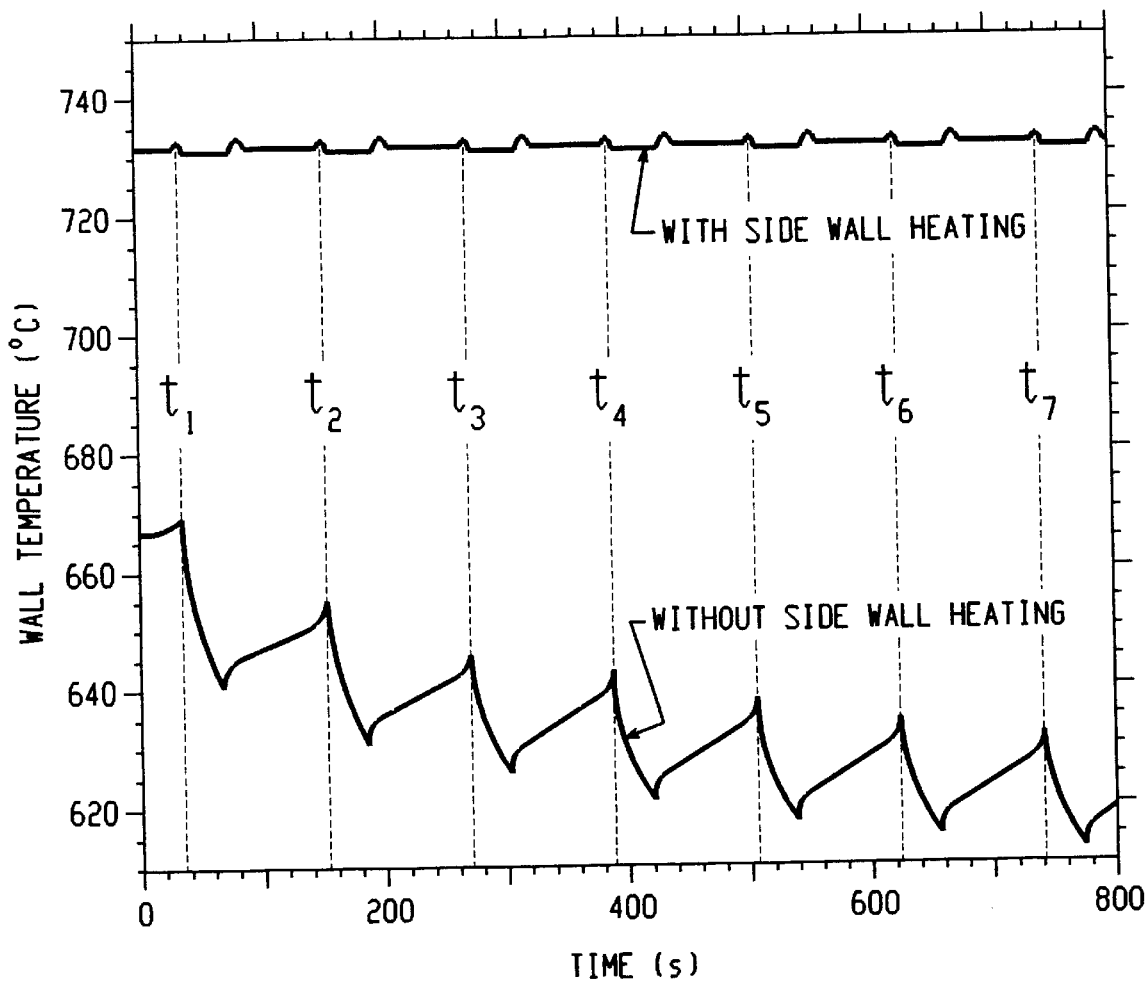
FIG. 3 is a graphical representation of sidewall temperature characteristics exhibited by prior art systems and further showing improvements in the consistency of these characteristics using the present invention.

FIG. 3 shows the operational enhancements provided by the sidewall heating mechanism of the present invention. As shown in this Figure, consistency of the sidewall temperature at a particular location on the sidewall is improved using the present invention, as compared to an RTP system which does not utilize independent sidewall heating. FIG. 3 shows a graphical representation of sidewall temperature at a longitudinal location about midway along the axis X of the bell jar 18, over the course of processing seven wafers, both with and without utilizing the sidewall heating mechanism of the present invention. The sidewall temperature is plotted against time.

In one typical operation of an RTP system, a wafer is positioned on the pedestal 32 through transfer chamber 36 and moved to a position along the axis X below the longitudinal position represented by FIG. 3. The wafer is momentarily held to soak at that position (e.g., for 10–20 seconds). This time frame is represented by the 10–20 second interval prior to times $t_1$–$t_7$ in FIG. 3. The temperature of the sidewall at the longitudinal location of FIG. 3 (which is presently above the wafer), rises in part due to downward convection of heat from the top heater 22.

After this initial soak position, the wafer is raised to a higher temperature by elevating the pedestal 32 within the process chamber 20 to a position above that represented by the longitudinal sidewall position of FIG. 3. This time frame is represented by the 20–30 second interval immediately after the times $t_1$–$t_7$. During this time the position of the wafer is finely adjusted by the system controller 14 to subject the wafer to the desired heating process.

In the case of no sidewall heating, the sidewall temperature at the longitudinal location of FIG. 3 (which is presently below the wafer) drops off significantly as soon as the wafer passes this location, because the position of the wafer between the longitudinal location represented by FIG. 3 and the top heater blocks the downward convection of heat. Accordingly, in the case of no sidewall heating, the peak temperature at the longitudinal location of FIG. 3 is obtained just prior to the wafer passing that location (i.e. precisely at times $t_1$–$t_7$, representing the sequential processing of seven wafers). Thus, without sidewall heating, it remains difficult to precisely control the temperature gradient within the process chamber 20, as the temperature at a particular longitudinal location within the chamber is in part dependent upon the position of the wafer being processed. FIG. 3 shows how this temperature inconsistency problem is eliminated using the sidewall heating mechanism of the present invention, irrespective of wafer location within the process chamber.

In addition to the problem of sidewall temperature variations occurring during the processing of a single wafer, in the case of no sidewall heating, sidewall temperature variations are also encountered in subsequent wafer-to-wafer processing as measured between successive wafer processes. This phenomenon is represented in FIG. 3 by the generally downward movement or drift of the sidewall temperature graph from wafer one (prior to and after time $t_1$) through wafer seven (prior to and after time $t_7$). This generally downward temperature slide is also caused by blockage of radiant heat from the top heater by the successive wafers being processed. This effect is especially pronounced for the first few wafers processed, and then becomes less pronounced as heat conduction downward along the process chamber sidewall counters this effect. FIG. 3 also shows how this wafer-to-wafer temperature inconsistency problem is eliminated using the sidewall heating mechanism of the present invention.

Thus, the use of more than one independently controlled heating modules positioned at a corresponding number of longitudinal locations along the vertical process chamber significantly improves system performance. Sidewall temperature variations which would otherwise occur during the processing of a single wafer, as well as between successive wafers, are notably diminished. Minor temperature variations shown in FIG. 3 may be eliminated by fine tuning of the control system of FIG. 2.

Accordingly, a preferred embodiment of an improved sidewall heated vertical RTP system has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

We claim:

1. A thermal processing system (10), comprising:

a vertical process chamber (20) extending along a longitudinal axis (X);

a movable platform (32) disposed within said process chamber and having a generally horizontal support surface disposed substantially perpendicular to said longitudinal axis (X) and upon which one or more substrates (W) may be positioned horizontally for processing at a vertical location along said axis (X);

a temperature control subsystem (56, 58, 60) for establishing a continuous and stepless temperature gradient within said vertical process chamber along said longitudinal axis, said temperature control subsystem comprising a plurality of heating elements (24) located at different vertical positions along said longitudinal axis, each of said plurality of heating elements having associated therewith a heater controller (16) for heating its associated heating element independently of the other of said plurality of heating elements;

a temperature sensor (42) for monitoring temperature at or near the location of said movable platform (32);

a movement mechanism (50) for imparting vertical movement to said movable platform; and a position controller (40) for receiving a feedback signal from said temperature sensor (42) and providing in response thereto a position signal to said movement mechanism (50) to adjust the vertical position of said movable platform within said vertical process chamber to effect desired heating of the substrate.

2. The thermal processing system of claim 1, wherein each of said heating elements comprises a resistive heating element disposed circumferentially about the perimeter of said vertical process chamber.

3. The thermal processing system of claim 2, wherein each of said heater controllers further comprises a thermocouple for measuring the temperature of said vertical process chamber at a particular vertical location.

4. The thermal processing system of claim 3, wherein said thermocouples are located on a wall of said vertical process chamber.

5. The thermal processing system (10) of claim 1, wherein said temperature sensor is an optical pyrometer (42).

6. The thermal processing system of claim 3, wherein said thermocouples each output an actual temperature feedback signal, each of said heater controllers comparing said actual temperature feedback signal with a desired temperature reference input signal to selectively energize and deenergize its corresponding heating element depending on the difference between the desired and actual temperature signals.

7. A vertical thermal processing system (10), comprising:

a vertical process chamber (20) extending along a longitudinal axis (X) and being defined by a sidewall containment structure (18);

a movable platform (32) disposed within said process chamber and having a generally horizontal support surface disposed substantially perpendicular to said longitudinal axis (X) and upon which one or more substrates (W) may be positioned horizontally for processing at a vertical location along said axis (X);

a temperature control subsystem (56, 58, 60) for establishing a continuous and stepless temperature gradient within said vertical process chamber along said longitudinal axis, said temperature control subsystem comprising a top heating element (22) and at least one sidewall heating element (24) circumscribing said sidewall containment structure, said top heating element and said at least one sidewall heating element having associated therewith a heater controller (16) for independently heating its associated heating element independently of the other;

a temperature sensor (42) for monitoring temperature at or near the location of said movable platform (32);

a movement mechanism (50) for imparting vertical movement to said movable platform; and a position controller (40) for receiving a feedback signal from said temperature sensor (42) and providing in response thereto a position signal to said movement mechanism (50) to adjust the vertical position of said movable platform within said vertical process chamber to effect desired heating of the substrate.

* * * * *